United States Patent [19]

Hayakawa et al.

[11] Patent Number: 4,806,994
[45] Date of Patent: Feb. 21, 1989

[54] SEMICONDUCTOR DEVICE

[75] Inventors: Toshiro Hayakawa, Nara; Takahiro Suyama; Kohsei Takahashi, both of Tenri; Saburo Yamamoto, Nara, all of Japan

[73] Assignee: Sharp Kabushiki Kaisha, Osaka, Japan

[21] Appl. No.: 73,854

[22] Filed: Jul. 14, 1987

Related U.S. Application Data

[63] Continuation of Ser. No. 801,777, Nov. 26, 1985, abandoned.

[30] Foreign Application Priority Data

Nov. 29, 1984 [JP] Japan .................................. 59-253885

[51] Int. Cl.$^4$ ..................... H01L 27/12; H01L 29/161
[52] U.S. Cl. ............................................ 357/4; 357/16; 357/17; 357/4
[58] Field of Search ........................... 357/45 L, 16, 17

[56] References Cited

U.S. PATENT DOCUMENTS 4,163,237 7/1979 Dingle et al. .
4,205,329 5/1980 Dingle et al. .
4,261,771 4/1981 Dingle ................................. 357/4
4,558,336 12/1985 Chang ................................. 357/4
4,607,272 8/1986 Osbourn ............................. 357/4
4,620,206 10/1986 Ohta .................................... 357/4

FOREIGN PATENT DOCUMENTS 58-207684 3/1983 Japan .

OTHER PUBLICATIONS

W. T. Masselink et al., "Improved GaAs/AlGaAs Singe Quantum Wells . . . ", 320 *App. Phy. Letters,* 44 (1984), Feb. 4, N.Y., U.S.A.

*Primary Examiner*—Martin H. Edlow
*Attorney, Agent, or Firm*—Birch, Stewart, Kolasch & Birch

[57] ABSTRACT

A semiconductor device having a superlattice composed of two kinds of semiconductor materials, wherein the lattice unit of said superlattice is composed of periodically laminated layers consisting of four or more kinds of thin layers which are different from each other in the combination of materials and thickness.

14 Claims, 1 Drawing Sheet

SEMICONDUCTOR DEVICE

This application is a continuation, of application Ser. No. 801,777 filed on Nov. 26, 1985, now abandoned.

BACKGROUND OF THE INVENTION

1. Field of the invention:

This invention relates to a semiconductor device such as a semiconductor laser device, a transistor, etc., which contains semiconductor multiple thin films formed by molecular beam epitaxy (MBE), metal-organic chemical vapor deposition (MO-CVD), etc.

2. Description of the prior art:

Recently, a single crystal growth technique for the formation of thin films such as molecular beam epitaxy (MBE), metal-organic chemical vapor deposition (MO-CVD), etc., has been developed which enables the formation of thin film growth layers having a thickness of as thin as approximately 10 Å. The development of such a technique allowed the production of the thin film layers to be applied to laser devices. However, these significantly thin film layers have not yet been produced by liquid phase epitaxy (LPE).

An example of these laser devices is a superlatticed device having a periodic multiple-layered structure of plural semiconductor thin films. Typical superlatticed devices are composed of alternate layers consisting of two kinds of semiconductor thin films (the thickness thereof being approximately 100 Å or less) which are typically made of $Ga_{1-x}Al_xAs$ ($0x \leqq 1$). Since the lattice constants of two different $Ga_{1-x}Al_xAs$ materials are well matched, lattice defects based on internal stresses are rare.

The main feature of superlattices is that multiple-layered thin films are formed with a periodicity which is longer than the lattice constant (several Å), resulting in repeat of the band structure in the reciprocal lattice space thereof. Such a deformity of the band structure allows the regulation of electrical characteristics of the superlattices. For instance, a superlattice which is composed of alternate layers consisting of two GaAs layers and two AlAs layers provides a multiple-layered structure having a periodicity which is two times the lattice constant, resulting in a band structure which is folded to the two halves of the Brillouin band in the reciprocal lattice space in the lamination direction. As mentioned above, the main feature of superlattices is that the band structure can be changed without changing the kinds of crystal elements. However, so long as $Ga_{1-x}Al_xAs$ materials are used for the formation of superlattices, the change of the band structure is attained only by either a change of the AlAs mole fraction x or a change of the layer thickness of the two kinds of $Ga_{1-x}Al_xAs$ layers, so that a change of the band structure can be only attained in a limited range.

On the other hand, in the case where even such bulk crystals such as a SiC crystal are of a polytype (i.e., 2H type, 3C type and 6H type), even if one of the various type crystals had the same elements and composition ratio as another, various crystals having different crystal structure and different band structure can be obtained when the elements of each of the crystals are arranged with a different periodicity. That is, with regard to the lamination of SiC layer units in the direction of the C-axis, three kinds of lattice positions (hereinafter referred to as A, B and C) exist; for example, the 2H type crystal provides a superlatticed structure of ABAB..., the 3C type crystal provides a superlatticed structure of ABCABC... and the 6H type crystal provides a superlatticed structure of ABCACBABCACB.... Moreover, the energy gaps of the 2H type, the 3C type and the 6H type are 3.33 eV, 2.39 eV and 3.02 eV, respectively, which are quite different from each other. Artificial polytype superlattices can be produced by the use of three or more kinds of crystal elements. For instance, a superlattice which results from the periodical lamination of InSb layers (the thickness of each layer being 50 Å), GaSb layers (the thickness of each layer being 50 Å) and AlSb layers (the thickness of each layer being 50 Å) is different in band structure from another superlattice which results from the periodical lamination of InSb layers (the thickness of each layer being 50 Å), GaSb layers (the thickness of each layer being 50 Å), InSb layers (the thickness of each layer being 50 Å) and AlSb layers (the thickness of each layer being 50 Å). However, these polytype superlattices must be composed of three or more kinds of crystal elements and cannot be produced using the combination of GaAs and AlAs, the lattice constants of which are well matched.

On the other hand, superlattices can be designed using the combination of semiconductor thin layers (e.g., $GaAs_{1-x}P_x$ ($x<1$) and GaP, $In_xGa_{1-x}As$ ($x<0$) and GaAs, etc.), the lattice constants of which are not matched. When the thickness of each layer of these superlattices, which are so-called strained superlattices, is approximately 100 Å or less, the internal stress due to the matchless lattice constants therebetween is too small to cause dislocation and accordingly the resulting crystals have almost no lattice defects therein. Thus, the use of such strained superlattices enlarges the degree of freedom in the choice of materials. Since energy gaps of superlattices are generally greater than those of the semiconductor thin layers constituting the superlattices, the use of a superlattice for the active region of a semiconductor laser device enables the shortening of the oscillation wavelength of laser light which is produced by the device. However, when strained superlattices are employed for the active region, the rapid formation of lattice defects and the multiplication thereof occur, making it difficult to put such strained superlattices to practical use.

SUMMARY OF THE INVENTION

The semiconductor device of this invention which overcomes the above-discussed and numerous other disadvantages and deficiencies of the prior art, has a superlattice composed of two kinds of semiconductor materials, wherein a lattice unit of the superlattice is composed of periodically laminated layers consisting of four or more kinds of thin layers which are different from each other in the combination of materials and thickness.

The lattice constants of said two kinds of semiconductor materials are, in a preferred embodiment, well matched.

The two kinds of semiconductor materials are, in a preferred embodiment, binary compounds of GaAs and AlAs.

The lattice unit constitutes, in a preferred embodiment, cladding layers sandwiching an active layer therebetween for semiconductor laser devices.

Thus, the invention described herein makes possible the objects of (1) providing a semiconductor device having a superlattice which is composed of two kinds of semiconductor materials and which can be regulated with an extended degree of freedom; and (2) superlatticed semiconductor devices which can be produced with different band structures notwithstanding the combination of two kinds of semiconductor materials such as GaAs and AlAs, the lattice constants of which are well matched are applied to each of the devices.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 2:
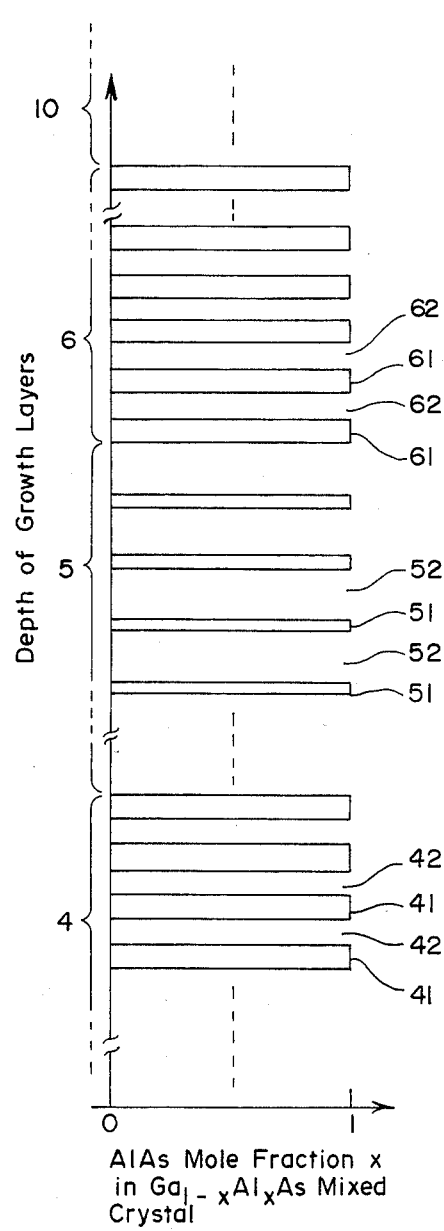
FIG. 2 is a diagram showing the distribution of the AlAs mole fraction (i.e., x) in a conventional $Ga_{1-x}Al_xAs$ superlatticed semiconductor laser device.

A superlatticed semiconductor laser device of this invention is described below in comparison with a conventional semiconductor laser device:

FIG. 2 shows the distribution of the AlAs mole fraction x in a $Ga_{1-x}Al_xAs$ mixed crystal in a conventional superlatticed semiconductor laser device consisting of two kinds of binary compounds (i.e., GaAs and AlAs), wherein the abscissa is the AlAs mole fraction of 1 and the GaAs mole fraction of 0 and the ordinate is the dimension in the direction of the thicknesses of the growth layers. This conventional superlatticed semiconductor laser device is produced as follows: On an n-GaAs substrate (not shown), a superlatticed cladding layer 4 which is composed of alternate layers consisting of two hundred fifty n-GaAs layers (the thickness of each layer being 20 521 ) 42 and two hundred fifty n-AlAs layers (the thickness of each layer being 20 Å) 41, a superlatticed active layer 5 which is composed of alternate layers consisting of ten non-doped GaAs layers (the thickness of each layer being 40 Å) 52 and nine non-doped AlAs layers (the thickness of each layer being 10 Å) 51, a superlatticed cladding layer 6 which is composed of alternate layers consisting of two hundred fifty p-AlAs layers (the thickness of each layer being 20 Å) 61 and two hundred forty nine p-GaAs layers (the thickness of each layer being 20 Å) 62, and a p-GaAs cap layer 10 having a thickness of 0.5 μm are successively grown by molecular beam epitaxy. On the resulting wafer, an $Al_2O_3$ oxide film having a striped structure with a stripe width of 10 μm and a cavity length of 250 μm is then formed to obtain a superlatticed semiconductor laser device which oscillates laser light having an oscillation wavelength of 750 nm at a threshold current Ith of 80 mA.

Figure 1:
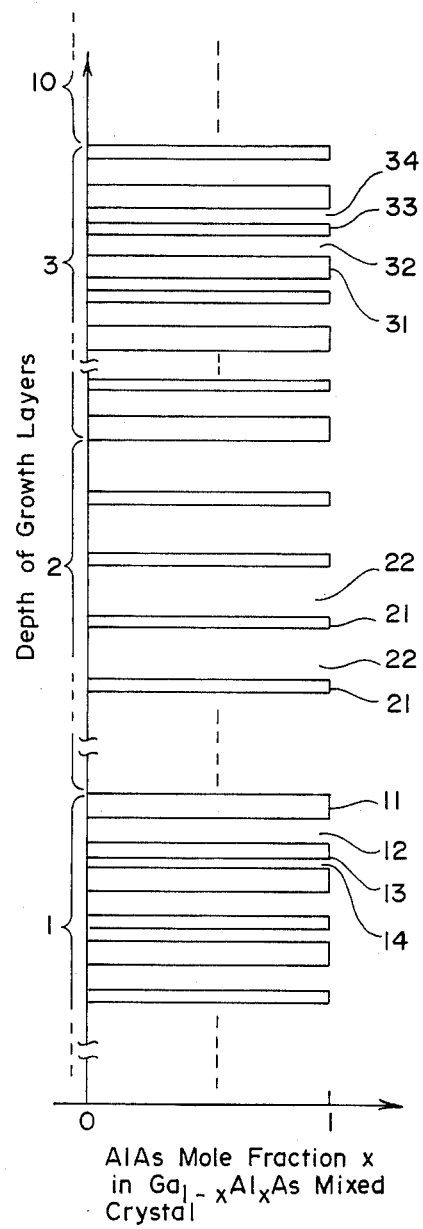
FIG. 1 is a diagram showing the distribution of the AlAs mole fraction (i.e., x) in a $Ga_{1-x}Al_xAs$ superlatticed semiconductor laser device of this invention.

FIG. 1 shows the distribution of the AlAs mole fraction x in a $Ga_{1-x}Al_xAs$ mixed crystal in a superlatticed semiconductor laser device of this invention consisting of two kinds of binary compounds (e.g., GaAs and AlAs), wherein the abscissa is the same AlAs mole fraction as that of FIG. 2 and the ordinate is the same dimension as that of FIG. 2. This superlattice semiconductor laser device of this invention is produced as follows: On an n-GaAs substrate (not shown), a superlatticed cladding layer 1 which is composed of periodic layers consisting of one hundred fifty n-GaAs layers (the thickness of each layer being 10 Å) 14, one hundred fifty n-AlAs layers (the thickness of each layer being 10 Å) 13, one hundred fifty n-GaAs layers (the thickness of each layer being 20 Å) 12 and one hundred fifty n-AlAs layers (the thickness of each layer being 20 Å) 11; a superlatticed active layer 2 which is composed of alternate layers consisting of ten non-doped GaAs layers (the thickness of each layer being 40 Å) 22 and nine non-doped AlAs layers (the thickness of each layer being 10 Å) 21; a superlatticed cladding layer 3 which is composed of periodic layers consisting of one hundred fifty p-AlAs layers (the thickness of each layer being 20 Å) 31, one hundred fifty p-GaAs layers (the thickness of each layer being 20 Å) 32, one hundred fifty p-AlAs layers (the thickness of each layer being 10 Å) 33 and one hundred forty nine p-GaAs layers (the thickness of each layer being 10 Å) 34; and a p-cap layer 10 having a thickness of 0.5 μm are successively grown by molecular beam epitaxy. On the resulting wafer, an $Al_2O_3$ oxide film having a striped structure with a stripe width of 10 μm and a cavity length of 250 μm is then formed, resulting in a superlatticed semiconductor laser device which has the same oscillation characteristics as the above-mentioned conventional device attaining laser oscillation with an oscillation wavelength of 750 nm at a threshold current Ith of 80 mA.

The active layer 2 in the above-mentioned laser device of this invention shown in FIG. 1 is the same structure as the active layer 5 in the conventional laser device shown in FIG. 2, and moreover the far-field pattern in the direction which is vertical to the junctions of the active layer 2 in the laser device of this invention exhibits a lobe full-width of the half maximum of approximately 25 degrees, which is the same as in the conventional laser device shown in FIG. 2. Thus, the refraction indexes of the cladding layers 1 and 3 in the laser device of this invention are nearly equal to those of the cladding layers 4 and 6, respectively, in the conventional laser device shown in FIG. 2.

The relationship between the threshold current Ith and the specific temperature To of both the superlatticed semiconductor laser devices mentioned above can be represented by the formula:

$$Ith \alpha \exp(T/To)$$

wherein T is a temperature in the oscillation region to be examined, but which falls in the range of 20° C. to 70° C. at which current leakage into the cladding layers becomes essential to the determination of the temperature characteristics of these semiconductor laser devices:

Pulse current having a pulse-time of 1 μ sec. and a frequency of 1 KHz was used for the determination of the temperature characteristics of the above-mentioned superlatticed semiconductor laser devices, resulting in a specific temperature To of 120° K for the conventional laser device shown in FIG. 2 whereas a specific temperature of 160° K for the laser device of this invention shown in FIG. 1 which is significantly greater than that of the conventional laser device. This indicates that the effective energy gap between the cladding layers 1 and 3 in the laser device of this invention shown in FIG. 1 is greater than that between the cladding layers 4 and 6 in the conventional laser device shown in FIG. 2. It can be understood that the superlatticed semiconductor laser device of this invention enables the change of the band structure therein without changing the refraction index thereof.

This invention is not limited to the above-mentioned superlattice, but can be applied to another novel superlattice which contains, as a lattice unit, periodic layers consisting of two AlAs layers, three GaAs layers, two AlAs layers, two GaAs layers, one AlAs layer, two GaAs layers, two AlAs layers and three GaAs layers. According to this superlatticed structure, the modulation of a layer thickness can be attained.

The lattice unit which is composed of periodically laminated layers consisting of four kinds of thin layers can be applied to the active layer in addition to or instead of the cladding layers. Moreover, the kinds of thin layers constituting the lattice unit can be set to be more than four by the use of thin layers with different thicknesses (e.g., 10 Å, 20 Å and 30 Å).

Although conventional superlattices are designed with the repetition of potentials, which are greater or smaller than those of the carrier therein, to thereby attain a superlatticed structure having a periodicity which is longer than that of a superlattice unit of bulk crystal, the above-mentioned superlattice of this invention allows for the repetition of potentials with a longer periodicity than the conventional superlattices thereby attaining a different band structure from conventional band structures. Thus, the superlatticed structure of this invention can be also applied to field effect transistors (FET), high electron mobility transistors (HEMT), light emitting diodes (LED), etc.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A semiconductor device having a superlattice structure which comprises a plurality of cladding and active lattice units, wherein each of said cladding and each of said active lattice units have a uniform thickness and each of said lattice units includes a plurality of laminated lattice layers formed from two different semiconductor materials, said laminated lattice layers varying from each other within each of said lattice units with respect to the combination of semiconductor materials and thickness.

2. A semiconductor device according to claim 1, wherein the lattice constants of said semiconductor materials are well matched.

3. A semiconductor device according to claim 1, wherein said semiconductor materials comprise GaAs and AlAs.

4. A semiconductor device according to claim 1, wherein said lattice units form
first and second cladding layers each including a plurality of cladding lattice units and
an active layer including a plurality of active lattice units, said active layer being disposed between said cladding layers;
and wherein said semiconductor device is a semiconductor laser device.

5. A semiconductor device according to claim 2, wherein said semiconductor materials comprise GaAs and AlAs.

6. A semiconductor device according to claim 4, wherein said laminated lattice layers comprise four different kinds of layers varying from each other with respect to the combination of semiconductor material and thickness.

7. A semiconductor device according to claim 3, wherein said laminated lattice layers comprise four different kinds of layers varying from each other with respect to the combination of semiconductor material and thickness.

8. A semiconductor device according to claim 4, wherein said first cladding layer is formed on a substrate, said active layer formed on said first cladding layer, said second cladding layer is formed on said active layer, and a cap layer formed on said second clad layer.

9. A semiconductor device according to claim 8, wherein said substrate comprises GaAs and said first cladding layer comprises a plurality of first cladding lattice units each comprising a first AlAs layer of a first thickness formed on a first GaAs layer of said first thickness, a second GaAs layer of a second thickness formed on said first AlAs layer, and a second AlAs layer of said second thickness formed on said second GaAs layer.

10. A semiconductor device according to claim 9, wherein said active layer comprises a plurality of active lattice units each comprising a third AlAs layer of a third thickness formed on a third GaAs layer of a fourth thickness.

11. A semiconductor device according to claim 10, wherein said second cladding layer comprises a plurality of second cladding lattice units each comprising a fourth GaAs layer of a fifth thickness formed on a fourth AlAs layer of said fifth thickness, a fifth AlAs layer of a sixth thickness formed on said fourth GaAs layer, and a fifth GaAs layer of said sixth thickness formed on said fifth AlAs layer.

12. A semiconductor device according to claim 9, wherein said second cladding layer comprises a plurality of second cladding lattice units each comprising a fourth GaAs layer of a fifth thickness formed on a fourth AlAs layer of said fifth thickness, a fifth AlAs layer of a sixth thickness formed on said fourth GaAs layer, and a fifth GaAs layer of said sixth thickness formed on said fifth AlAs layer.

13. A semiconductor device according to claim 11, wherein the thicknesses of said first GaAs and AlAs layers are the same as the thicknesses of said fifth GaAs and AlAs layers.

14. A semiconductor device according to claim 13, wherein the thicknesses of said second GaAs and AlAs layers are the same as the thicknesses of said fourth GaAs and AlAs layers.

* * * * *